(12) United States Patent
Shimizu et al.

(10) Patent No.: US 11,812,541 B2
(45) Date of Patent: Nov. 7, 2023

(54) ELECTRONIC COMPONENT TRAY

(71) Applicant: Murata Manufacturing Co., Ltd., Nagaokakyo (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 269 days.

(21) Appl. No.: 17/347,705

(22) Filed: Jun. 15, 2021

(65) Prior Publication Data
US 2021/0315118 A1 Oct. 7, 2021

Related U.S. Application Data

(63) Continuation of application No. PCT/JP2019/047774, filed on Dec. 6, 2019.

(30) Foreign Application Priority Data

Dec. 20, 2018 (JP) .................... 2018-238285

(51) Int. Cl.
*B65D 73/02* (2006.01)
*H05K 5/03* (2006.01)
(Continued)

(52) U.S. Cl.
CPC ............. *H05K 5/03* (2013.01); *B65D 43/02* (2013.01); *B65D 75/367* (2013.01); *H05K 5/061* (2013.01);
(Continued)

(58) Field of Classification Search
CPC ...... H05K 13/0084; H05K 5/03; H05K 5/061; H05K 13/02; B65D 73/02; B65D 2585/86;
(Continued)

(56) References Cited

U.S. PATENT DOCUMENTS

2002/0167570 A1 11/2002 Udagawa et al.
2003/0183553 A1* 10/2003 Fujimura ........... H05K 13/0084
206/719
(Continued)

FOREIGN PATENT DOCUMENTS

CN 108216915 A 6/2018
JP 05-71188 U 9/1993
(Continued)

OTHER PUBLICATIONS

First Office Action in KR10-2021-7021235, dated Feb. 7, 2023, 4 pages.
(Continued)

*Primary Examiner* — King M Chu
(74) *Attorney, Agent, or Firm* — KEATING & BENNETT, LLP

(57) ABSTRACT

An electronic component package includes an electronic component storage container including a main body with recesses to store electronic components positioned along a longitudinal direction of the main body and including openings on one side in a height direction of the main body, a cover sheet to cover the openings of the recesses and removably attached to the main body, and a cover positioned such that the cover sheet is between the cover and the main body, and electronic components stored in the recesses of the electronic component storage container, the electronic component package has a volume filling rate of the electronic components in at least one of the recesses of about 50% or higher.

20 Claims, 6 Drawing Sheets

(51) Int. Cl.
*H05K 5/06* (2006.01)
*B65D 43/02* (2006.01)
*B65D 75/36* (2006.01)

(52) U.S. Cl.
CPC .... *B65D 2575/365* (2013.01); *B65D 2585/86* (2013.01)

(58) Field of Classification Search
CPC ...... B65D 75/367; B65D 43/12; B65D 43/20; B65D 43/02; B65D 75/327
USPC .................................. 206/714, 725, 713, 564
See application file for complete search history.

(56) References Cited

U.S. PATENT DOCUMENTS

| | | | | |
|---|---|---|---|---|
| 2007/0256958 | A1* | 11/2007 | Zhang | H05K 13/0084 206/509 |
| 2010/0122927 | A1* | 5/2010 | Matsuoka | B65D 75/366 206/438 |
| 2011/0155624 | A1 | 6/2011 | Caron et al. | |
| 2012/0118789 | A1* | 5/2012 | Hiramatsu | B32B 27/08 206/714 |
| 2016/0049754 | A1* | 2/2016 | Girard, Jr. | H05K 13/00 361/679.01 |
| 2018/0184555 | A1* | 6/2018 | Rossmann | B65G 65/32 |
| 2018/0312317 | A1* | 11/2018 | Petrous | A01M 23/30 |

FOREIGN PATENT DOCUMENTS

| | | |
|---|---|---|
| JP | 05-338683 A | 12/1993 |
| JP | 06-39762 U | 5/1994 |
| JP | 3011132 U | 5/1995 |
| JP | 10-278989 A | 10/1998 |
| JP | 2000-33715 A | 2/2000 |
| JP | 2004-323028 A | 11/2004 |
| JP | 2005225552 A | 8/2005 |
| JP | 2005263257 A | 9/2005 |
| JP | 2013-193786 A | 9/2013 |
| JP | 2018-118787 A | 8/2018 |

OTHER PUBLICATIONS

Office Action in JP2020-561302, dated Aug. 23, 2022, 3 pages.
Official Communication issued in corresponding Chinese Patent Application No. 201980083933.2 dated May 19, 2022.
Official Communication issued in International Patent Application No. PCT/JP2019/047774, dated Jan. 14, 2020.
Shimizu et al., "Electronic Component Storage Container, and Electronic Component Package", U.S. Appl. No. 17/347,704, filed Jun. 15, 2021.

* cited by examiner

ELECTRONIC COMPONENT TRAY

CROSS REFERENCE TO RELATED APPLICATIONS

This application claims the benefit of priority to Japanese Patent Application No. 2018-238285 filed on Dec. 20, 2018 and is a Continuation Application of PCT Application No. PCT/JP2019/047774 filed on Dec. 6, 2019. The entire contents of each application are hereby incorporated herein by reference.

BACKGROUND OF THE INVENTION

1. Field of the Invention

The present invention relates to an electronic component package including an electronic component storage container in which electronic components are stored.

2. Description of the Related Art

An exemplary package for electronic components, typically multilayer ceramic capacitors, is a package including a storage container filled with multiple electronic components. In the process of handling such a storage container, from filling the container with electronic components to setting the container in a feeder, sealing of the upper surface of the portion which stores electronic components therein with a cover film by heat welding has been suggested to prevent entering of foreign substances or different products, to prevent dropping of small electronic components, or to provide a gas barrier for a long life of the electronic components.

JP 2018-118787 A discloses a magazine (packaging) for storing individualized electronic components. The packaging in JP 2018-118787 A includes a receiving structure (main body) which has multiple cavities (recesses) arranged along the longitudinal direction of the receiving structure, a cover structure (cover) which is arranged at an upper side of the main body, and a closure foil (cover sheet) that is interposed between the main body and the cover and is removably connected to the main body.

The inventors of preferred embodiments of the present invention have discovered that the packaging of JP 2018-118787 A may fail to maintain the seal due to partial separation of the heat-weld cover sheet caused by the expansion of the air remaining inside the storage recess as the external environment such as temperature or air pressure changes.

SUMMARY OF THE INVENTION

Preferred embodiments of the present invention provide electronic component packages that each include an electronic component storage container in which electronic components are stored and that are each capable of maintaining the seal even with external environmental changes.

An electronic component package according to a preferred embodiment of the present invention includes an electronic component storage container including a main body including multiple recesses to store electronic components, the multiple recesses being positioned along a longitudinal direction of the main body and respectively including openings on one side in a height direction of the main body; a cover sheet to cover the openings of the recesses and removably attached to the main body; and a cover positioned such that the cover sheet is between the cover and the main body, and electronic components stored in the recesses of the electronic component storage container, wherein the electronic component package has a volume filling rate of the electronic components in at least one of the recesses of about 50% or higher.

Preferred embodiments of the present invention provide electronic component packages that each include an electronic component storage container in which electronic components are stored and are each capable of maintaining the seal even with external environmental changes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic component packages according to preferred embodiments of the present invention are described below with reference to the drawings.

The present invention is not limited to the structures described below and may be appropriately modified to an extent not changing the advantageous effects of the present invention. The present invention includes combinations of two or more of the preferred embodiments described below.

The preferred embodiments described below are examples, and the structures among different preferred embodiments may be partially exchangeable or used in combination. For the second and following preferred embodiments, only the matters different from the first preferred embodiment are described while omitting the matters in common with the first preferred embodiment. In particular, the advantageous effects achievable by the same or corresponding structure is not individually described for those preferred embodiments.

First Preferred Embodiment

Electronic Component Package

Figure 1:
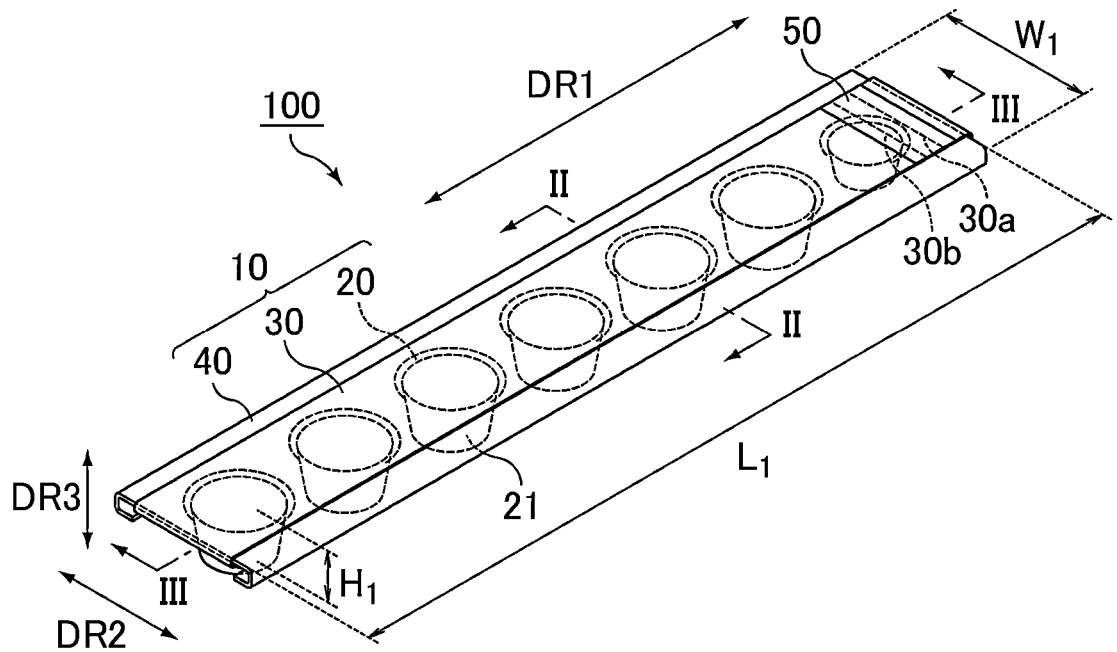
FIG. 1 is a perspective view schematically showing an exemplary electronic component package according to a first preferred embodiment of the present invention.
Figure 2:
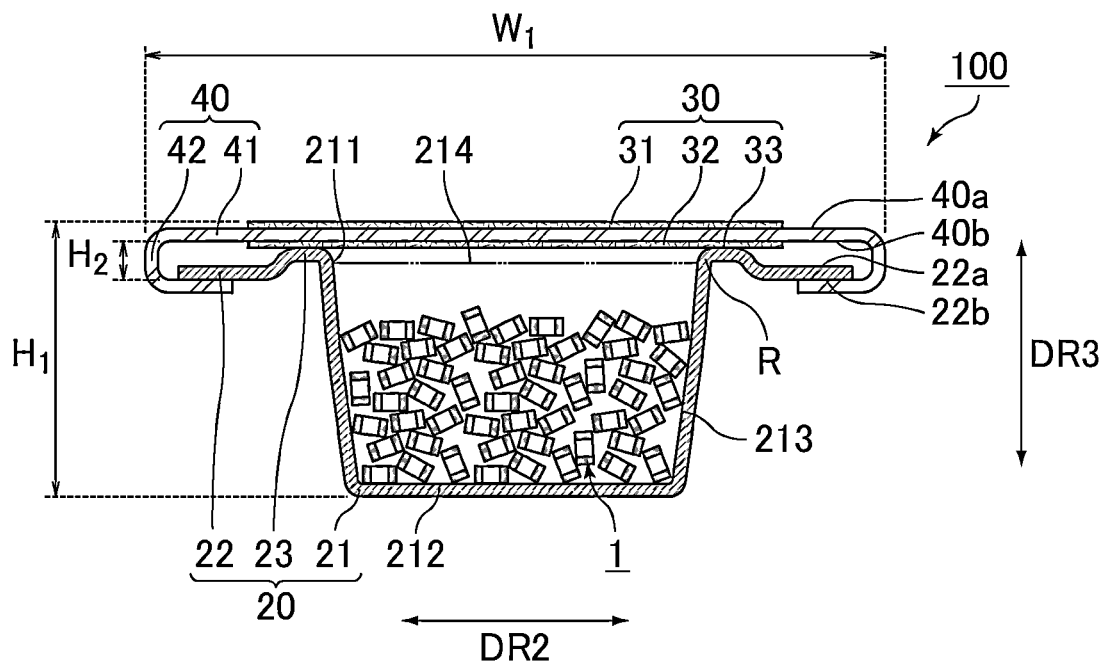
FIG. 2 is a II-II line cross-sectional view of the electronic component package in FIG. 1.
Figure 3:
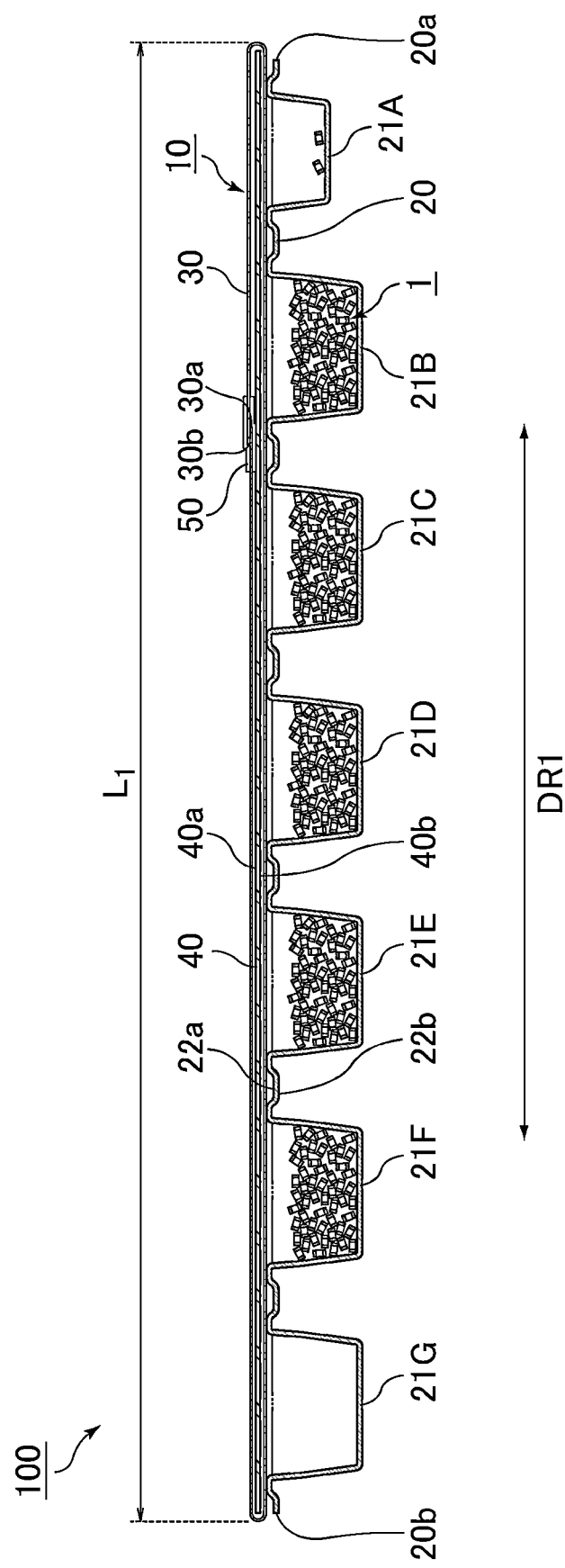
FIG. 3 is a line cross-sectional view of the electronic component package in FIG. 1.

FIG. 1 is a perspective view schematically showing an exemplary electronic component package according to a first preferred embodiment of the present invention. FIG. 2 is a II-II line cross-sectional view of the electronic component package in FIG. 1. FIG. 3 is a III-III line cross-sectional view of the electronic component package in FIG. 1.

An electronic component package 100 in FIG. 1, FIG. 2, and FIG. 3 includes an electronic component storage container 10 and multiple electronic components 1 stored in the electronic component storage container 10 (see, FIG. 2 and FIG. 3).

As shown in FIG. 1, the electronic component storage container 10 includes a main body 20, a cover sheet 30, and a cover 40. For example, the electronic component storage container 10 has an elongated shape with a longitudinal direction (DR1 direction) and a width direction (DR2 direction). The longitudinal direction is parallel or substantially parallel to a sliding direction (AR1 direction in FIG. 5) described later. The width direction is orthogonal or substantially orthogonal to the longitudinal direction. In a plan view in a height direction (DR3 direction), the main body 20, the cover sheet 30, and the cover 40 each have a rectangular or substantially rectangular shape, for example. The height direction is orthogonal or substantially orthogonal to the longitudinal direction and the width direction.

The main body 20 extends along the longitudinal direction. The main body 20 includes multiple recesses 21 to store the electronic components 1. The main body 20 of the electronic component package 100 in FIG. 1 includes seven recesses 21, for example.

The recesses 21 are disposed along the longitudinal direction. In the electronic component package 100 in FIG. 1, the seven recesses 21 are arranged in one line along the longitudinal direction.

As shown in FIG. 2, the recesses 21 respectively include openings 211 on one side in the height direction. In a plan view in the height direction, the openings 211 each have a circular or substantially circular shape, for example.

As shown in FIG. 3, a recess 21A disposed at a first end 20a in the longitudinal direction of the main body 20 among the seven recesses 21A, 21B, 21C, 21D, 21E, 21F, and 21G has a smaller opening area and a smaller depth than those of the other recesses 21B, 21C, 21D, 21E, 21F, and 21G. The recess 21G disposed at a second end 20b in the longitudinal direction of the main body 20 has the same or substantially the same opening area and the same or substantially the same depth as those of the recesses excluding the recess 21A, i.e., 21B, 21C, 21D, 21E, and 21F.

The cover sheet 30 covers the openings 211 of the recesses 21. The cover sheet 30 is peelably attached to at least a portion of the main body 20.

The cover sheet 30 has a belt shape. The cover sheet 30 is longer than the cover 40 in the longitudinal direction. Preferably, the length of the cover sheet 30 is about twice the length of the main body 20 or longer, for example.

The cover 40 is disposed such that a portion of the cover sheet 30 is between the cover 40 and the main body 20. The cover 40 is engaged with the main body 20, slidably in the longitudinal direction.

The cover 40 is longer than the main body 20 in the longitudinal direction. Preferably, the length of the cover 40 is about half the length of the cover sheet 30 or shorter, for example.

As shown in FIG. 2 and FIG. 3, the multiple electronic components 1 are stored in the recesses 21 of the electronic component storage container 10.

The electronic component package 100 is configured such that the electronic components 1 stored in the recesses 21 can be extracted by sliding the cover 40 relative to the main body 20 in the longitudinal direction as described later.

The electronic components 1 are multilayer ceramic capacitors, for example. The size of the electronic components 1 is not limited, and the size may be 1005, 0603, 0402, or the like, for example. For example, when the electronic components 1 have 1005 size, the longitudinal dimension (L dimension) is about 1.0 mm and the width dimension (W dimension) is about 0.5 mm. Although not stipulated in the JIS standard, the thickness dimension (T dimension) is about 0.5 mm, for example. Herein, the L dimension, the W dimension, and the T dimension are all design target values and are not always accurately 1.0 mm, 0.5 mm, and 0.5 mm, respectively. Namely, the L dimension, the W dimension, and the T dimension have tolerances.

In the present preferred embodiment, as shown in FIG. 3, genuine products of the electronic components 1 are stored in the five recesses 21B, 21C, 21D, 21E, and 21F, excluding the recesses 21A and 21G at the ends. In contrast, a small number of the electronic components 1 for inspection are stored in the recess 21A disposed at the first end 20a of the main body 20. No electronic components 1 are stored in the recess 21G disposed at the second end 20b of the main body 20. Although, the genuine electronic components 1 may be stored in the recess 21G.

The electronic component package 100 has a volume filling rate of the electronic components 1 in at least one of the recesses 21 of about 50% or higher, for example. The filling rate is preferably about 55% or higher, for example.

When the filling rate of the electronic components 1 is about 50% or higher, the expansion of the air remaining inside the recess as the external environment, such as temperature and air pressure, for example, changes is reduced or prevented. Thus, the seal of the recess can be maintained.

The volume filling rate of the electronic components 1 in each recess 21 is preferably about 80% or lower, for example.

A filling rate of about 80% or lower allows the electronic components 1 to be less likely to protrude in the height direction from the recess 21 when they are being stored, thus facilitating the attachment of the cover sheet 30.

In the electronic component package of the present preferred embodiment, the filling rate of the genuine electronic components 1 in each recess (recess 21B, 21C, 21D, 21E, or 21F in FIG. 3) is about 50% or higher, for example. The filling rate of electronic components 1 for inspection in a recess (recess 21A in FIG. 3) is not necessarily about 50% or higher.

Hereinafter, the term "recess(es) 21" refers to the recess(es) in which the genuine electronic components 1 are stored (recesses 21B, 21C, 21D, 21E, and 21F in FIG. 3) unless otherwise specified.

Preferably, the recesses 21 each store, for example, 3,000 or more of the electronic components 1. For example, when the electronic components 1 are in 1005 size, each recess 21 preferably stores about 3,000 or more and about 7,000 or less of the electronic components 1. When the electronic components 1 are in 0603 size, each recess 21 preferably stores about 12,000 or more and about 35,000 or less of the electronic components 1. When the electronic components 1 are in 0402 size, each recess 21 preferably stores about 60,000 or more and about 110,000 or less of the electronic components 1.

Preferably, all of the recesses 21 store the same or substantially the same number of the electronic components 1. All of the recesses 21 excluding the recess 21A for inspection preferably have the same or substantially the same volume. Thus, the filling rates of the electronic components 1 in all of the recesses 21 excluding the recess 21A for inspection are preferably the same or substantially the same.

When the recess 21A is used for inspection, preferably, for example, one or more and 20 or less of the electronic components 1 are stored in the recess 21A. When the recess 21A is not used for inspection, no electronic components 1 may be stored in the recess 21A.

Main Body

In the present preferred embodiment, as shown in FIG. 2, the main body 20 includes the recesses 21, a strip section 22, and a bulge 23. The main body 20 is formed by processing a sheet material, for example. Examples of the material to form the main body 20 include polystyrene and polyethylene terephthalate which include conductive materials, such as, for example, carbon and conductive coating compositions kneaded therein. The main body 20 has a thickness of about 0.5 mm, for example.

The multiple recesses 21 may be disposed in one, two, three, or more lines as long as they are disposed along the longitudinal direction. The multiple recesses 21 may be disposed in a matrix, staggered (zigzag), or random manner, for example.

Preferably, at least one dimension selected from an opening area and a depth of the recess 21A, which is one of the multiple recesses 21 and is disposed at the first end 20a in the longitudinal direction of the main body 20, is smaller than a corresponding dimension of the other recesses.

The presence of the recess having a different size only at one end in the longitudinal direction of the main body allows users to recognize the direction by the appearance. This reduces the risk of attaching the container to equipment such as, for example, a fixing device described later in a wrong direction or the risk of peeling the cover sheet in a wrong direction.

The recess 21A, which is one of the multiple recesses 21 and is disposed at the first end 20a of the main body 20 in the longitudinal direction, is preferably a recess for inspection storing fewer electronic components than the other recesses.

In this case, pre-use inspection can be performed by individually extracting only the electronic components for inspection while the recesses storing the genuine electronic components are sealed. Examples of the pre-use inspection include inspection of qualities such as electrical characteristics and inspection for differences between product label information and actually packaged products.

The recess 21A may define and function both as a recess for direction recognition and as a recess for inspection.

In the present preferred embodiment, the recesses 21 each include a bottom 212 and a peripheral wall 213, and an opening 211 which opposes the bottom 212. The bottom 212 is parallel or substantially parallel to the strip section 22. The peripheral wall 213 stands from the rim of the bottom 212. The opening 211 is provided at an end side of the peripheral wall 213 connected to the strip section 22.

In a plan view in the height direction, the opening 211 of each recess 21 preferably has a shape without an edge extending in a direction perpendicular or substantially perpendicular to a relative sliding direction, described later, of the cover 40. For example, the opening 211 preferably has a circular or substantially circular or oval or substantially oval shape in a plan view, for example. The opening 211 may have a polygonal shape, such as, for example, a rhombus including one pair of vertices in the longitudinal direction and the other pair of vertices in the width direction in a plan view.

Due to such a shape of the opening 211, as the cover 40 slides relative to the main body 20, the attached area between the cover sheet 30 and the portions of the main body 20 at the periphery of the openings 211 gradually changes along a peeling direction. Thus, upon peeling the cover sheet 30, the cover sheet 30 can be prevented from breaking due to instantaneous application of a strong force to an attached portion 33 (see FIG. 2) of the cover sheet 30 or from becoming unpeelable.

The recesses 21 are made of resin, for example. The inner surfaces of the recesses 21 preferably have a surface resistivity of, for example, about 0 Ω/sq or higher and about 1×109 Ω/sq or lower. When the inner surfaces of the recesses 21 have a surface resistivity within the above range, adhesion of the electronic components 1 due to static electricity to the inner surfaces of the recesses 21 is reduced or prevented.

The strip section 22 is engageable with a guide section 42 of the cover 40 described later. The main body 20 is held in the height direction by the cover 40 by the engagement of the strip section 22 of the main body 20 with the guide section 42 of the cover 40.

The strip section 22 includes a front surface 22a and a back surface 22b. The strip section 22 is parallel or substantially parallel to an opening plane 214 of each recess 21.

As shown in FIG. 2, the bulge 23 is preferably provided at a portion defining an end of each opening 211. The bulge 23 may be a portion of the main body 20 located at the periphery of each recess 21. The bulge 23 bulges in a direction (upward in FIG. 2) opposite to the depth direction (downward in FIG. 2) of the recess 21.

The bulge 23 surrounds the opening 211. The bulge 23 has the same or substantially the same shape as that of the edge defining the opening 211 in a plan view in the height direction. The rim of each recess 21 adjacent to the opening 211 includes a curved portion. The bulge 23 includes a curved portion that curves on the opening 211 side to follow the recess 21 in the depth direction toward the bottom 212 of the recess 21. The curve radius R of the curved portion is preferably about 0.1 mm or more and about 0.7 mm or less, for example. Such a curved portion prevents the multiple electronic components 1 from being captured by the bulge 23 upon extracting the multiple electronic components 1 from the recess 21.

The bulge 23 has a height of about 0.5 mm or more and about 1.2 mm or less, for example. The bulge 23 having the above-described height can prevent the electronic components 1 and the like from being caught between the cover 40 and the strip section 22. The bulge 23 has a width of about 1 mm or more and about 2 mm or less, for example. The bulge 23 having the above-described width can reduce the force required to peel the cover sheet 30 from the bulge 23. This prevents or reduces deformation of the cover 40 and the main body 20, and the cover sheet 30 can be stably peeled from the bulge 23.

Cover Sheet

In the present preferred embodiment, as shown in FIG. 1, FIG. 2, and FIG. 3, the cover sheet 30 is held by being wound around the cover 40. Specifically, the cover sheet 30 is preferably wound around the cover 40, with a width direction being the winding axis. Thus, the cover sheet 30 includes a portion 31 at a front side 40a of the cover 40 and a portion 32 at a back side 40b of the cover 40 (see FIG. 2).

As shown in FIG. 1, the first end 30a and the second end 30b of the cover sheet 30 are connected to each other with an adhesive tape 50, for example. Specifically, the first end 30a and the second end 30b of the cover sheet 30 are connected in an overlapping manner.

As described later, after the cover sheet 30 is attached to each of the multiple bulges 23, the cover sheet 30 is wound around the cover 40. Subsequently, the ends of the cover sheet 30 are connected to each other. The ends of the cover sheet 30 are not necessarily connected by an adhesive tape as described above and may be connected by any method as long as the ends are connected to each other.

As described later, the cover sheet 30 is wound around the cover 40 so that the cover sheet 30 circles around the cover 40 in conjunction with the relative sliding of the cover 40. The cover sheet 30 rotates around the cover 40 in direction DR4 shown in FIG. 5 when the cover 40 slides relatively along the sliding direction (AR1 direction in FIG. 5).

As described above, the cover sheet 30 is peelably attached to at least a portion of the main body 20. The cover sheet 30 includes the attached portion 33 (see FIG. 2) attached to at least a portion of the main body 20, specifically around each of the multiple openings 211.

The cover sheet 30 preferably has an adhesion strength of about 0.4 N/mm$^2$ or higher and about 1.0 N/mm$^2$ or lower, and more preferably about 0.4 N/mm$^2$ or higher and about 0.6 N/mm$^2$ or lower, for example. The cover sheet 30 having an adhesion strength within the above-described range can maintain the adhesiveness between the cover sheet 30 and the main body 20.

The adhesion strength of the cover sheet is measured by, for example, a measurement method according to a peel strength test of a cover tape of taping packaging components defined in JIS C0806-3 (P. 21).

The cover sheet 30 is made of a heat-weldable material, for example. In this case, the cover sheet 30 is attached by heat welding to the main body 20, and more specifically, to each of the multiple bulges 23. The adhesiveness between the cover sheet 30 and the bulges 23 at the attached portion 33 is preferably small in order to prevent or reduce the adhesion of the electronic components 1 to a portion where the cover sheet 30 has been peeled upon extracting the electronic components 1 from the recesses 21.

The cover sheet 30 may be attached to the main body 20, more specifically, to the bulges 23 by an adhesive. The cover sheet 30 is preferably transparent but may not necessarily be transparent.

Examples of the materials of the cover sheet 30 include polyethylene terephthalate, polycarbonate, acrylic, and vinyl chloride. The cover sheet 30 may be coated with a metal, for example.

The cover sheet 30 preferably has a surface resistivity of about $1 \times 10^{11}$ Ω/sq or lower, for example. This can prevent or reduce adhesion of the electronic components 1 due to static electricity to the surface of the cover sheet 30.
Cover In the present preferred embodiment, as shown in FIG. 1, FIG. 2, and FIG. 3, the cover 40 is disposed such that a portion of the cover sheet 30 is between the cover 40 and the main body 20, more specifically, between the cover 40 and the bulges 23. Preferably, a surface of the cover 40 opposing the main body 20 is not fixed or attached to the cover sheet 30.

In the present preferred embodiment, the cover 40 includes a plate section 41 and the guide section 42 and is engaged with the main body 20, slidably in the longitudinal direction. The plate section 41 extends along the longitudinal direction. The plate section 41 is parallel or substantially parallel to the strip section 22. The cover sheet 30 is wound around the plate section 41.

The guide section 42 is provided at each end of the plate section 41 in the width direction.

The guide section 42 guides sliding of the cover 40 relative to the main body 20 while preventing the cover 40 from falling off of the main body 20. Specifically, the guide section 42 is disposed at each end of the strip section 22, with a space between the strip section and the guide section, such that the strip section 22 is positioned between a portion opposing the front side 22a of the strip section 22 and a portion opposing the back side 22b of the strip section 22.

The shape of the guide section 42 can be suitably changed as long as the cover 40 can slide relative to the main body 20.

The cover 40 is formed by, for example, molding such as vacuum molding or injection molding. Examples of the materials of the cover 40 include resin. The cover 40 may or may not be transparent. When the cover 40 and the cover sheet 30 are transparent, the storing of the multiple electronic components 1 in the recesses 21 can be confirmed by visual observation or the like.

The cover 40 is preferably longer than the main body 20 in the longitudinal direction. Preferably, the length of the cover 40 is, for example, about half the length of the cover sheet 30 or shorter in the longitudinal direction.

The electronic component package 100 in FIG. 1 is preferably produced as described below.

First, a required number of the electronic components 1 are stored in the predetermined recesses 21, and the multiple recesses 21 are covered with the cover sheet 30. Thereafter, the cover sheet 30 is heat-welded and attached to the multiple bulges 23. Upon covering the multiple recesses 21 with the cover sheet 30, the cover sheet 30 is disposed on the main body 20 in the longitudinal direction so that the cover sheet 30 sticks out from the ends of the main body 20 in the longitudinal direction. Next, the cover sheet 30 is cut to a predetermined length. The predetermined length is a length that allows the cover sheet 30 to be wound around the cover 40. Subsequently, the cover 40 is disposed such that the cover sheet 30 on the main body 20 is between the cover 40 and the main body 20. Then, as described above, the portions of the cover sheet 30 sticking out of the ends of the main body 20 are wound around the cover 40, and the ends of the cover sheet 30 are connected to each other. Accordingly, the electronic component package 100 in which the multiple electronic components 1 are sealed in the multiple recesses 21 is produced.

The electronic component storage container 10 has a longitudinal dimension (a length indicated by $L_1$ in FIG. 1 and FIG. 3) of about 169 mm±1 mm, for example. The electronic component storage container 10 has a width dimension (a length indicated by $W_1$ in FIG. 1 and FIG. 2) of about 35.8 mm±1 mm, for example. The electronic component storage container 10 has a height dimension (a length indicated by $H_1$ in FIG. 1 and FIG. 2) of about 13.7 mm, for example.

In the electronic component storage container 10, the engaged portion of the main body 20 and the cover 40 has a height (a length indicated by $H_2$ in FIG. 2) of about 2 mm±0.2 mm, for example.

Figure 4A:
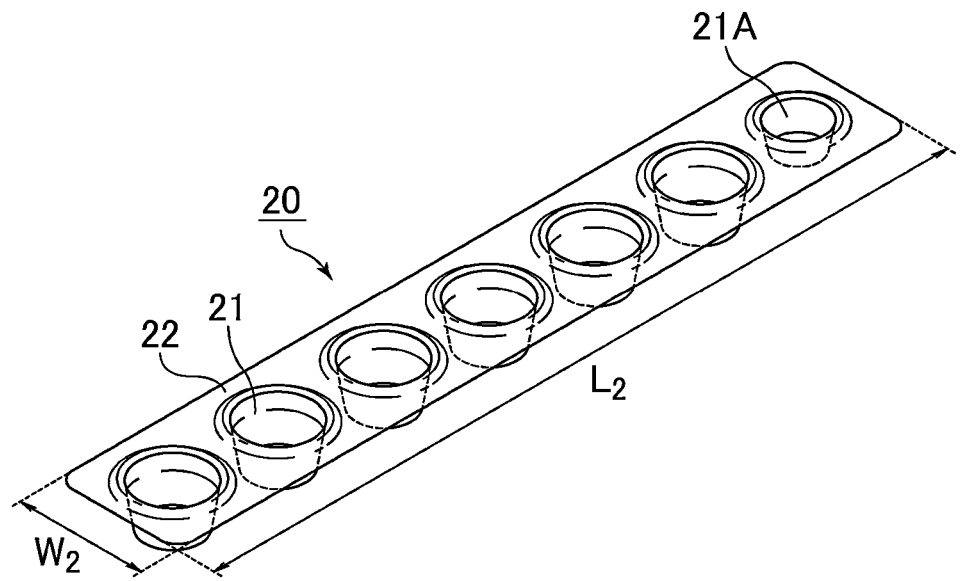
FIGS. 4A and 4B each are a perspective view schematically showing a main body of an electronic component storage container included in the electronic component package in FIG. 1.
Figure 4B:
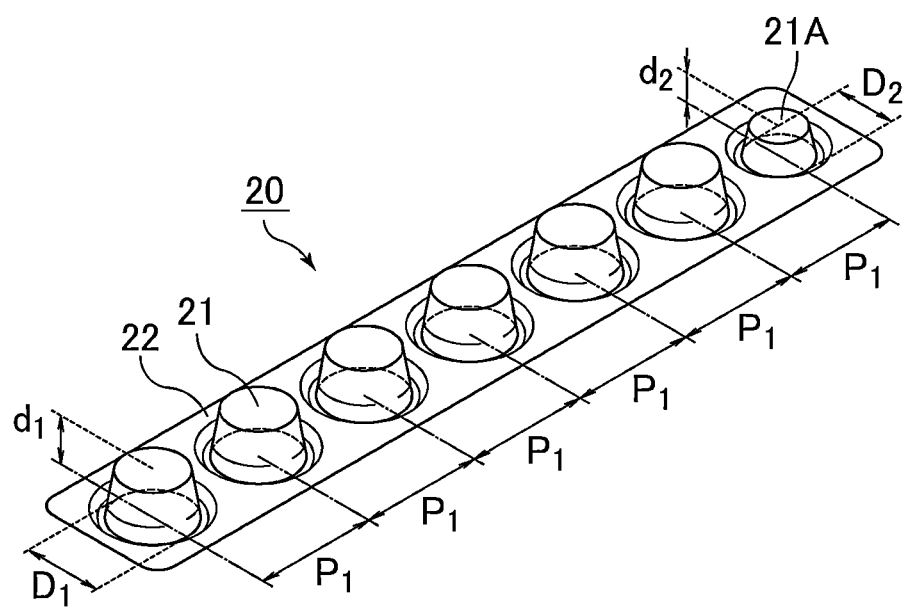

FIGS. 4A and 4B each are a perspective view schematically showing a main body of an electronic component storage container included in the electronic component package in FIG. 1.

The main body 20 has a longitudinal dimension (a length indicated by $L_2$ in FIG. 4A) of about 168 mm±1 mm, for example. The main body 20 has a width dimension (a length indicated by $W_2$ in FIG. 4A) of about 32 mm±0.3 mm, for example.

The recesses 21 excluding the recess 21A each have an outer diameter (a length indicated by $D_1$ in FIG. 4B) of about 19 mm±0.2 mm, for example. The recesses 21 excluding the recess 21A each have a depth dimension (a length indicated by $d_1$ in FIG. 4B) of about 12.5 mm±0.5 mm, for example.

The recess 21A has an outer diameter (a length indicated by $D_2$ in FIG. 4B) of about 15 mm±0.2 mm, for example. The recess 21A has a depth dimension (a length indicated by $d_2$ in FIG. 4B) of about 5.5 mm±0.5 mm, for example. Preferably, the outer diameter, the depth dimension, and the volume of the recess 21A are, for example, respectively about 80% or less, about 50% or less, and about 30% or less of those of the other recesses 21.

The recesses 21 including the recess 21A each have a pitch (a length indicated by Pi in FIG. 4B) of about 24.0 mm±0.1 mm, for example. Herein, the pitch of the recesses 21 refers to the distance between centers of recesses which are next to each other.

Figure 5:
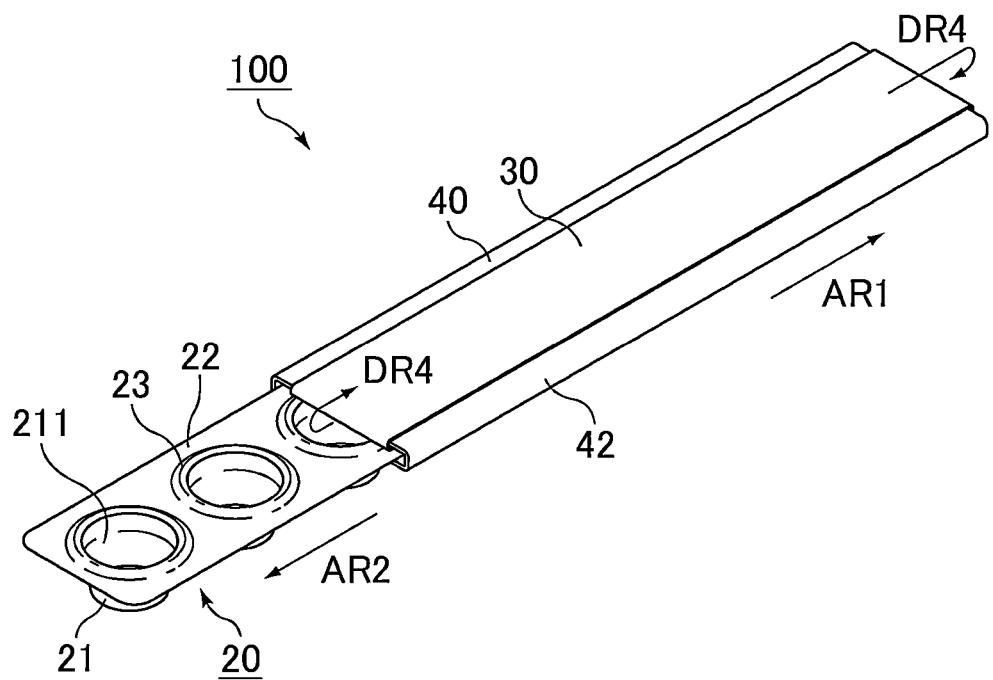
FIG. 5 is a perspective view schematically showing sliding of a cover of the electronic component package in FIG. 1 relative to a main body.
Figure 6:
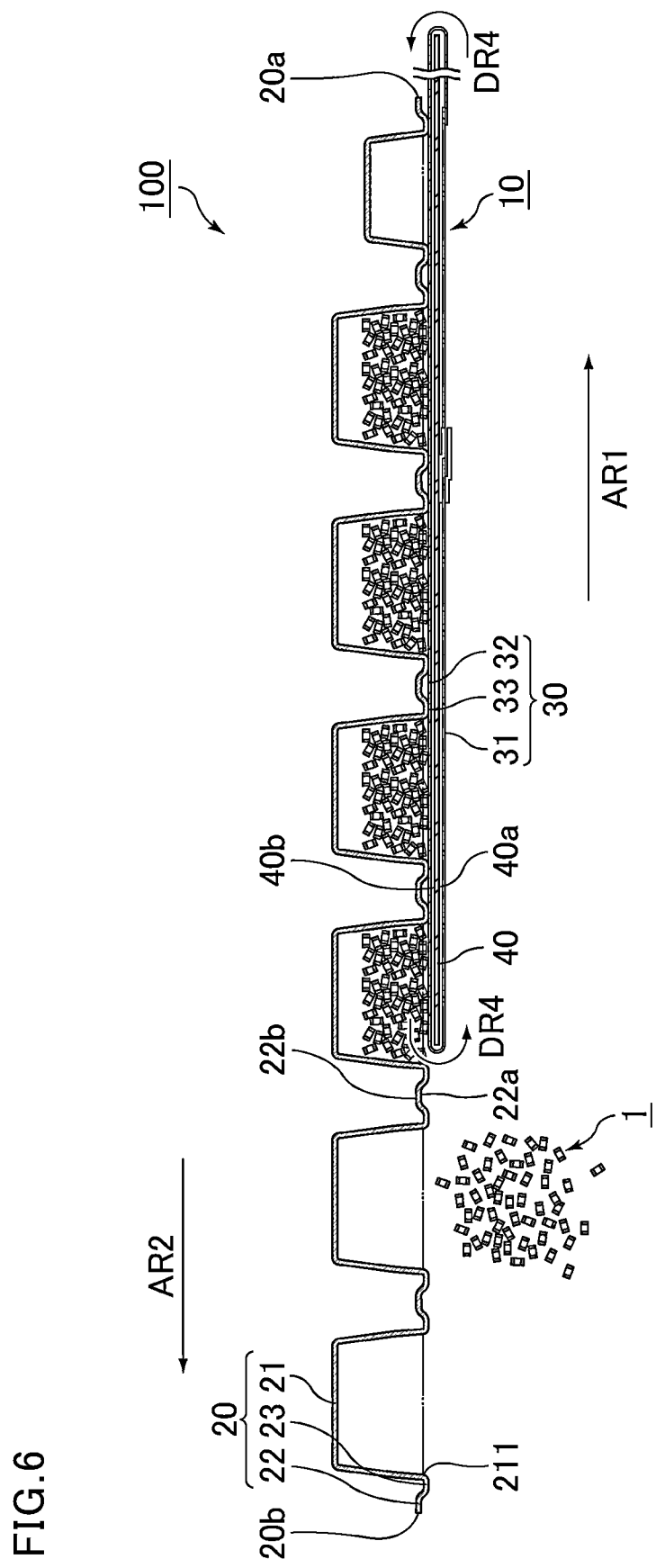
FIG. 6 is a cross-sectional view schematically showing extraction of electronic components from the electronic component package in FIG. 1.

FIG. 5 is a perspective view schematically showing sliding of a cover of the electronic component package in FIG. 1 relative to a main body. FIG. 6 is a cross-sectional view schematically showing extraction of electronic components from the electronic component package in FIG. 1. For convenience, FIG. 5 shows the electronic component package 100 with the openings 211 of the recesses 21 facing up. Although, upon extracting the electronic components 1, it is preferable to slide the cover 40 relative to the main body 20 while the electronic component package 100 is disposed with the openings 211 of the recesses 21 facing down as shown FIG. 6. The following describes how the electronic components 1 are extracted from the electronic component package 100 according to the present preferred embodiment, with reference to FIG. 5 and FIG. 6.

As shown in FIG. 5 and FIG. 6, the multiple electronic components 1 stored in the recesses 21 are extracted by sliding the cover 40 relative to the main body 20 in the sliding direction (AR1 direction). Specifically, the cover 40 is fixed by a fixing device (not shown), and the main body 20 is slid in a direction (AR2 direction) opposite to the AR1 direction. The main body 20 is moved by a predetermined distance by a transfer device (not shown). The transfer device may be a conveyor that moves the main body 20 disposed thereon, or may be configured to move the main body 20 by gripping the main body 20. Here, when the recess 21A is provided as a recess for direction recognition, users can recognize the direction by the appearance. Thus, the risk of attaching the electronic component storage container to equipment such as a fixing device, for example, in a wrong direction is reduced. This also reduces the risk of peeling the cover sheet 30 in a wrong direction.

When the cover 40 moves relatively in the sliding direction (AR1 direction), first, a peeling force acts on the attached portion 33 positioned downstream of the relative sliding direction of the cover 40. Further relative sliding of the cover 40 allows the cover sheet 30 to be gradually peeled in the relative sliding direction of the cover 40.

At this time, the cover sheet 30 rotates around the cover 40 as indicated by direction DR4 in conjunction with the relative sliding of the cover 40. Specifically, at a location downstream of the relative sliding direction of the cover 40, the portion 32 adjacent to the back side 40b of the cover 40 moves to be adjacent to the front side 40a of the cover 40, while upstream of the relative sliding direction of the cover 40, the portion 31 adjacent to the front side 40a of the cover 40 moves to be adjacent to the back side 40b of the cover 40. In this manner, the cover sheet 30 rotates around the winding axis.

When focus is set on one recess 21, the cover sheet 30 is peeled from the periphery (the bulge 23) of the opening 211, from one end to the other end in the relative sliding direction of the cover 40, such that the recess 21 is opened. As the recess 21 is opened, the multiple electronic components 1 drop downward from the opening 211 to be supplied to a supply receiving unit.

Preferably, the recess 21 has a smooth inner periphery without grooves or the like, so that catching of the multiple electronic components 1 on the inner periphery of the recess 21 can be prevented or reduced. Thus, the multiple electronic components 1 can be smoothly extracted from the electronic component storage container 10.

As the cover 40 slides relatively in direction AR1 from the second end 20b side to the first end 20a side of the main body 20, the cover sheet 30 is peeled from the bulges 23 in a direction from the second end 20b side to the first end 20a side of the main body 20, such that the recesses 21 are sequentially opened. Thus, the multiple electronic components 1 are sequentially extracted from the opened recesses 21. The relative sliding of the cover 40 may be performed continuously or intermittently.

As described above, the electronic component package 100 of the present preferred embodiment allows the multiple electronic components 1 to be smoothly extracted from the electronic component storage container 10.

In the present preferred embodiment, the cover 40 is configured such that its side opposing the main body 20 is not attached to the cover sheet 30. The cover 40 can move smoothly by the sliding of the cover 40 relative to the main body 20. Further, the cover sheet 30 can also move relative to the cover 40, allowing easy peeling of the cover sheet 30 from the main body 20.

Further, the cover 40 can slide relative to the main body 20 while the cover sheet 30 is held by the cover 40. Such a structure enables automatic opening of the recesses 21 with the use of the fixing device and the transfer device. Thus, the multiple electronic components 1 can be automatically supplied to the supply receiving unit.

In addition, the cover 40 can slide relative to the main body 20 in a direction parallel or substantially parallel to the opening planes of the recesses 21 while the cover sheet 30 is held by the cover 40. Such a structure can prevent or reduce deformation of the cover 40 and the main body 20 during peeling of the cover sheet 30.

Second Preferred Embodiment

In a second preferred embodiment of the present invention, an identification label is attached to the upper and lower surfaces of the electronic component storage container.

Figure 7A:
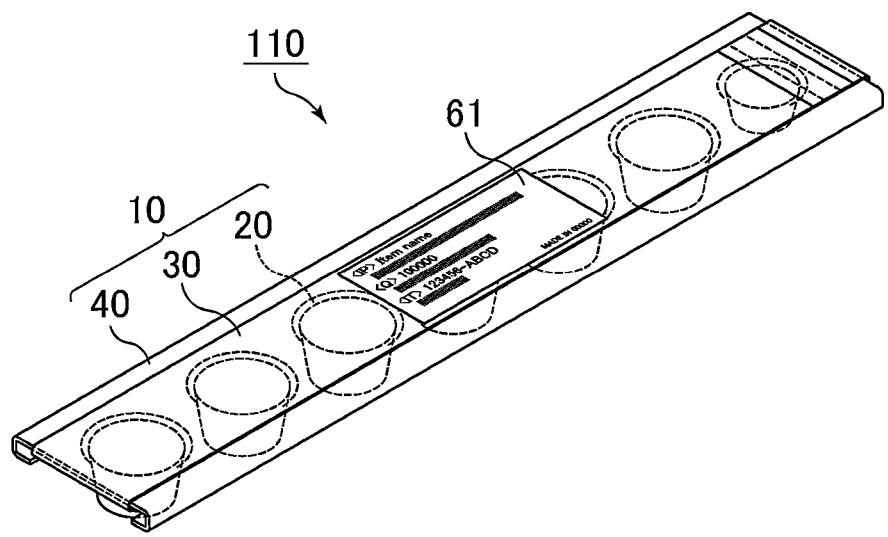
FIGS. 7A and 7B each are a perspective view schematically showing an exemplary electronic component package according to a second preferred embodiment of the present invention.
Figure 7B:
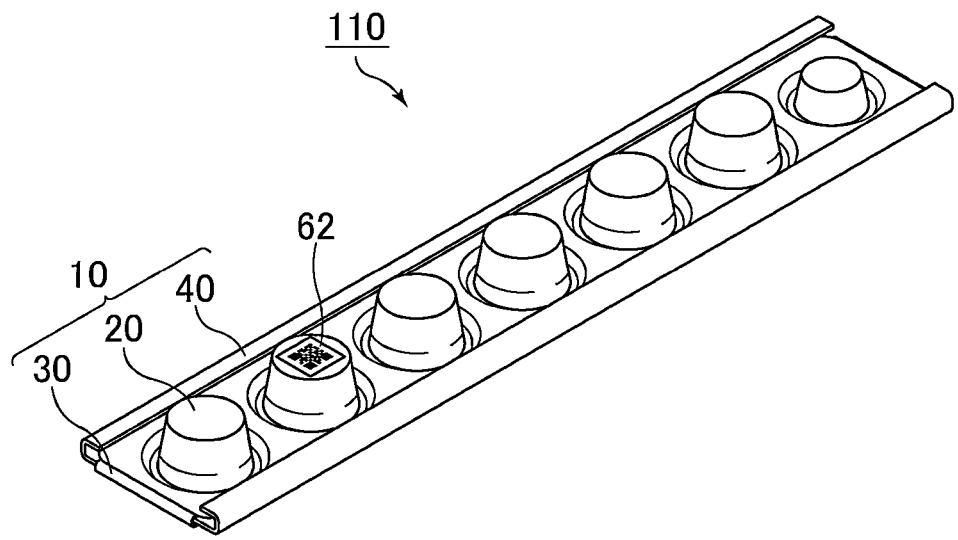

FIGS. 7A and 7B each are a perspective view schematically showing an exemplary electronic component package according to a second preferred embodiment of the present invention.

In the electronic component package 110 shown in FIGS. 7A and 7B, a first identification label 61 is attached to the cover 40 of the electronic component storage container 10, and a second identification label 62 is attached to the main body 20 of the electronic component storage container 10. The first identification label 61 may be attached between the cover sheet 30 and the cover 40 or on the upper surface of the cover sheet 30. The electronic component package 110 shown in FIGS. 7A and 7B has the same or substantially the same structure as the electronic component package shown in FIG. 1, except for including the first identification label 61 and the second identification label 62.

For example, the first identification label 61 includes the same barcode information as two-dimensional code information on the second identification label 62. The barcode information on the first identification label 61 includes, for example, production identification code, component identification code, quantity code, and traceability code. The first identification label 61 may further include readable information written in letters.

For details, refer to IEC 62090:2017 (Product package labels for electronic components using bar code and two-dimensional symbologies).

The second identification label 62 is attached to, for example, a back side of the recess 21 located closest to the second end 20b of the main body 20, among the recesses 21 that store the genuine electronic components 1.

For example, the second identification label 62 only includes the same two-dimensional code as the barcode information on the first identification label 61.

provided at each end of the strip section 22 of the main body 20 in the width direction. The guide section bends from the back side 40b of the cover 40 to the front side 40a of the cover 40 over the end faces of the cover 40.

EXAMPLES

The present invention is more specifically described by examples of preferred embodiments below. The present invention is not limited to those examples.

Examples 1 to 4

An electronic component package as shown in FIG. 1, FIG. 2, and FIG. 3 was produced. In the electronic component package, electronic components in the size and number indicated in Table 1 were stored in five of the recesses of an electronic component storage container.

The "0603 (high tolerance)" in Table 1 means that the dimensional tolerance of the electronic components is higher than that of size 0603 in Example 2. Specifically, the dimensional tolerance of the electronic components in Example 3 is about ±0.05 mm, while the dimensional tolerance of the electronic components in Example 2 is about ±0.03 mm.

The filling rate of electronic components was calculated from the volume of the recess and the total volume of the electronic components stored in the recess. Table 1 shows the filling rate.

TABLE 1

| | Electronic component | | | |
|---|---|---|---|---|
| | Size | Stored number [pcs] | Total volume [mm$^3$] | Recess Volume [mm$^3$] | Filling rate |
| Example 1 | 0402 | 100,000 | 2,032 | 3,000 | 68% |
| Example 2 | 0603 | 30,000 | 2,057 | 3,000 | 69% |
| Example 3 | 0603 (high tolerance) | 20,000 | 1,743 | 3,000 | 58% |
| Example 4 | 1005 | 6,000 | 1,905 | 3,000 | 64% |

The preferred embodiments of the electronic component package of the present invention are not limited to those described above. Various modifications and changes can be made without departing from the scope and spirit of the present invention, for example, in terms of configuration and production conditions of the electronic component storage containers.

The above preferred embodiments describe a case where the main body 20 slides while the cover 40 is fixed. Alternatively, the cover 40 may slide while the main body 20 is fixed. When the main body 20 slides while the cover 40 is fixed, the multiple electronic components 1 can be stably supplied to the supply receiving unit without changing the position of the supply receiving unit.

The above preferred embodiments describe a case where the bulge 23 is provided around each opening 211 of the main body 20. Alternatively, no bulges 23 may be provided. In this case, preferably, an inner periphery of each recess 21 defining the opening 211 includes a curved portion that curves on an opening edge to follow the recess 21 in the depth direction toward the bottom 212 of the recess 21. The curved portion preferably has a curve radius of about 0.1 mm or more and about 0.7 mm or less, for example.

The above preferred embodiments describe a case where the cover 40 includes the guide section 42. Alternatively, the main body 20 may include a guide section. In this case, the cover 40 has a flat plate shape, and the guide section is Comparative Example 1

Unlike Examples 1 to 4, an electronic component storage container in which all recesses stored no electronic components was produced.

The adhesion strength of the cover sheets of the electronic component packages in Examples 1 to 4 and the adhesion strength of the cover sheet of the electronic component storage container in Comparative Example 1 were measured. Both the adhesion strengths were within the range of about 0.4 N/mm$^2$ or higher and about 0.6 N/mm$^2$ or lower.

The electronic component packages in Examples 1 to 4 and the electronic component storage container in Comparative Example 1 were additionally prepared. They were stored at about 50° C. for about 100 hours. After storage, when partial separation of the cover sheet from the main body occurred and thus the seal was not maintained, it was judged as sealing failure. Table 2 shows whether sealing failure occurred or not.

TABLE 2

| | Electronic component | | | |
|---|---|---|---|---|
| | Size | Stored number [pcs] | Filling rate | Sealing failure |
| Example 1 | 0402 | 100,000 | 68% | No |
| Example 2 | 0603 | 30,000 | 69% | No |

TABLE 2-continued

| | Electronic component | | | |
|---|---|---|---|---|
| | Size | Stored number [pcs] | Filling rate | Sealing failure |
| Example 3 | 0603 (high tolerance) | 20,000 | 58% | No |
| Example 4 | 1005 | 6,000 | 64% | No |
| Comparative Example 1 | — | — | 0% | Yes |

Table 2 suggests that the electronic component packages in Examples 1 to 4 having a filling rate of electronic components of about 50% or higher are capable of maintaining the seal of the recesses for about 100 hours at about 50° C.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component package, comprising:
an electronic component storage container including:
a main body including multiple recesses to store electronic components, the multiple recesses being positioned along a longitudinal direction of the main body and respectively including openings on one side in a height direction of the main body;
a cover sheet to cover the openings of the recesses and removably attached to the main body; and
a cover positioned such that the cover sheet is between the cover and the main body; and
electronic components stored in the recesses of the electronic component storage container; wherein
the electronic component package has a volume filling rate of the electronic components in at least one of the recesses of about 50% or higher.

2. The electronic component package according to claim 1, wherein the filling rate is about 80% or lower.

3. The electronic component package according to claim 1, wherein the at least one of the recesses each store about 3,000 or more of the electronic components.

4. The electronic component package according to claim 1, wherein the cover sheet has an adhesion strength of about 0.4 N/mm² or more and about 1.0 N/mm² or less.

5. The electronic component package according to claim 1, wherein one of the multiple recesses which is disposed at a first end of the main body in the longitudinal direction is a direction recognition recess in which at least one dimension selected from an opening area and a depth is smaller than a corresponding dimension of another of the recesses.

6. The electronic component package according to claim 1, wherein one of the multiple recesses which is disposed at a first end of the main body in the longitudinal direction is an inspection recess storing fewer electronic components than another of the recesses.

7. The electronic component package according to claim 1, wherein the cover is engaged with the main body, slidably in the longitudinal direction.

8. The electronic component package according to claim 1, wherein the cover sheet is wound around the cover, with a width direction of the cover sheet perpendicular or substantially perpendicular to the longitudinal direction being a winding axis.

9. The electronic component package according to claim 1, wherein the filling rate is about 55% or higher.

10. The electronic component package according to claim 1, wherein a length of the cover sheet in the longitudinal direction is about twice a length of the main body or longer in the longitudinal direction.

11. The electronic component package according to claim 1, wherein a length of the cover in the longitudinal direction is about half a length of the cover sheet or shorter in the longitudinal direction.

12. The electronic component package according to claim 1, wherein the at least one of the recesses each store about 3,000 or more and about 7,000 or less of the electronic components.

13. The electronic component package according to claim 1, wherein the at least one of the recesses each store about 12,000 or more and about 35,000 or less of the electronic components.

14. The electronic component package according to claim 1, wherein the at least one of the recesses each store about 60,000 or more and about 110,000 or less of the electronic components.

15. The electronic component package according to claim 1, wherein the main body has a thickness of about 0.5 mm.

16. The electronic component package according to claim 1, wherein the recesses are made of resin.

17. The electronic component package according to claim 1, wherein inner surfaces of the recesses have a surface resistivity of about 0 Ω/sq or higher and about 1×109 Ω/sq or lower.

18. The electronic component package according to claim 1, wherein the openings of the recesses are each surrounded by a bulge.

19. The electronic component package according to claim 18, wherein the bulge includes a curved portion that curves on a side of the opening to follow the recess in a depth direction orthogonal or substantially orthogonal to the longitudinal direction.

20. The electronic component package according to claim 19, wherein a radius of curvature of the curved portion is about 0.1 mm or more and about 0.7 mm or less.

* * * * *